(12) United States Patent
Hirota

(10) Patent No.: US 8,500,912 B2
(45) Date of Patent: Aug. 6, 2013

(54) PLASMA PROCESSING METHOD AND PLASMA PROCESSING APPARATUS

(75) Inventor: Kousa Hirota, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 2 days.

(21) Appl. No.: 13/008,993

(22) Filed: Jan. 19, 2011

(65) Prior Publication Data

US 2012/0085366 A1    Apr. 12, 2012

(30) Foreign Application Priority Data

Oct. 7, 2010    (JP) ................................ 2010-227640

(51) Int. Cl.
*B08B 7/00* (2006.01)

(52) U.S. Cl.
USPC .......................................... 134/1.1; 438/905

(58) Field of Classification Search
None
See application file for complete search history.

(56) References Cited

U.S. PATENT DOCUMENTS

| | | | |
|---|---|---|---|
| 7,662,235 B2 | 2/2010 | Yoshida et al. | |
| 2003/0119328 A1* | 6/2003 | Fujisato | 438/709 |
| 2004/0126671 A1* | 7/2004 | Smith et al. | 430/5 |
| 2007/0281415 A1* | 12/2007 | Shibahara | 438/233 |
| 2007/0289609 A1* | 12/2007 | Lim et al. | 134/22.1 |
| 2010/0006976 A1* | 1/2010 | Kume et al. | 257/516 |

FOREIGN PATENT DOCUMENTS

| | | |
|---|---|---|
| JP | 11-140675 | 5/1999 |
| JP | 2001-176843 | 6/2001 |
| JP | 2006-237432 | 9/2006 |
| KR | 10-2006-0079352 | 7/2006 |

OTHER PUBLICATIONS

Korean Official Action dated Jan. 6, 2012, for KR Application No. 10-2011-0006220.

* cited by examiner

*Primary Examiner* — Nicole Blan
(74) *Attorney, Agent, or Firm* — Antonelli, Terry, Stout & Kraus, LLP.

(57) ABSTRACT

Provided is a plasma processing method capable of removing a Ti-series deposit from the surface of a processing chamber of a plasma processing apparatus without production of a foreign matter such as a boron oxide. The plasma processing method includes carbon-series deposition discharge which succeeds product etching during which a sample containing a Ti material is processed, and during which a carbon-series film is deposited on a Ti reaction by-product deposited on the surface of the processing chamber, and chlorine-series discharge which succeeds the carbon-series deposition discharge and during which the carbon-series film and Ti that are deposited on the surface of the processing chamber are removed.

8 Claims, 6 Drawing Sheets

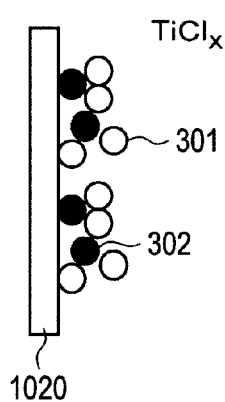
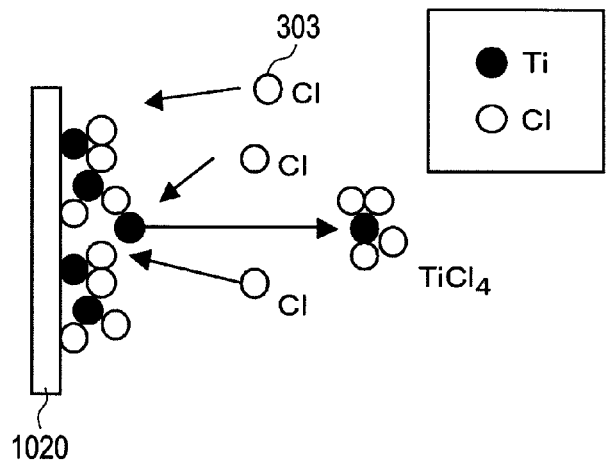
FIG. 3A  FIG. 3B
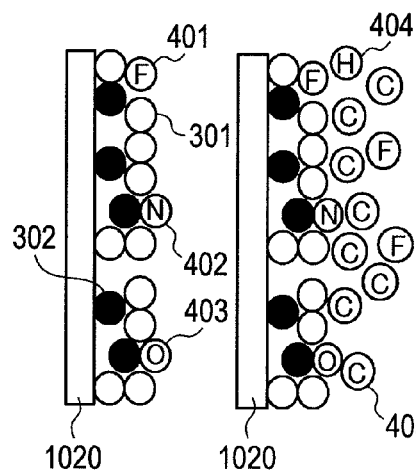
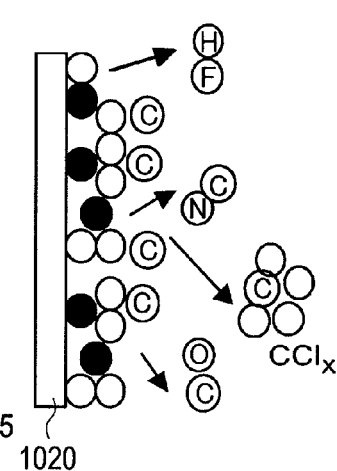
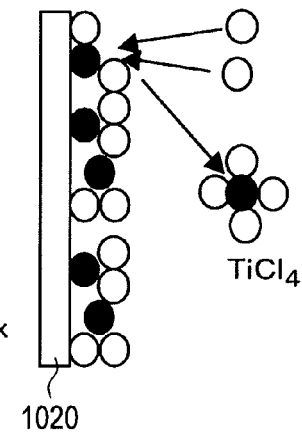
FIG. 4A  FIG. 4B  FIG. 4C  FIG. 4D

PLASMA PROCESSING METHOD AND PLASMA PROCESSING APPARATUS

CLAIM OF PRIORITY

The present application claims priority from Japanese patent application JP 2010-227640 filed on Oct. 7, 2010, the content of which is hereby incorporated by reference into this application.

BACKGROUND OF THE INVENTION

1. Field of the Invention

The present invention relates to a plasma processing apparatus and a plasma processing method which are employed in fabrication of semiconductor devices.

2. Description of the Related Art

Along with a recent tendency of semiconductor integrated circuits to high-density integration and high-processing speed performance, a gate electrode is requested to be further miniaturized. According to the International Technology Roadmap for Semiconductors 2008 Edition, a dimension of a gate of a 40 nm-node high-speed logic device has reached 22 nm in 2011, and precision in a processed dimension is requested to be equal to or smaller than 1.33 nm (3σ). In generations succeeding the 45 nm node, an existing silicon oxynitride (SiON)/polysilicon (poly-Si) gate electrode is being rapidly replaced with a high-dielectric constant (high-k) metal gate electrode in efforts to suppress a gate leakage current. However, since a minute variation in a dimension of a gate electrode leads to a large change in a source-drain current or a leakage current occurring on standby, stabilization of precision in the dimension (critical dimension (CD)) of the gate electrode or a processed shape thereof is a significant factor for improvement of a yield.

Conceivable as a factor for an adverse effect on the processed shape is the fact that a reaction by-product of etching may be deposited on the surface of a processing chamber. In this case, even when plasma is produced under the same condition, a quantity of consumed free radicals (hereinafter radicals) or a probability of recombination of radicals varies. The density of radicals in plasma is altered, and a processed shape is altered.

In order to improve a yield, occurrence of a pattern defect has to be suppressed. As one of causes of the pattern defect deriving from an etching processing apparatus, a deposit on the surface of the processing chamber is cited. A grown deposit peels off and drops onto a wafer at some time. Since the deposit that has dropped acts as a mask and hinders etching of an under-layer of the wafer. This brings about the pattern defect and invites a decrease in a product yield. The substance that hinders etching is called a foreign matter.

In order to improve the yield by achieving both a decrease in occurrence of a pattern defect and stabilization of a processed shape, proper dry cleaning of the surface of the processing chamber is necessary.

In the past, dry cleaning to be described below has been performed in order to remove a metallic deposit from the surface of the processing chamber. Japanese Patent Application Laid-Open Publication No. 11-140675 has revealed a method of cleaning out a titanium (Ti) deposit from the processing chamber by adding chlorine to a mixed gas of oxygen and methanol. Japanese Patent Application Laid-Open Publication No. 2006-237432 (Japanese Patent Application No. 2005-52434) has described that cleaning of an interior of the processing chamber is achieved by carrying out a process of removing a carbon-series substance using a mixed gas of oxygen and tetrafluorocarbon, and a process of removing a metallic film using a mixed gas of boron trichloride ($BCl_3$) and dichloride ($Cl_2$). Japanese Patent Application Laid-Open Publication No. 2001-176843 has unveiled a method of reducing a quantity of foreign matters by attaching a fluorocarbon film after completion of cleaning out an aluminum component using a mixed gas of $BCl_3$ and $Cl_2$.

SUMMARY OF THE INVENTION

However, in an apparatus described in Japanese Patent Application Laid-Open Publication No. 11-140675, a large quantity of oxyhydride (OH) radicals is actively generated. The OH radicals have a powerful oxidization ability and facilitates corrosion of a chamber member that contains a metal. In apparatuses described in Japanese Patent Application Laid-Open Publication No. 2005-52434 and Japanese Patent Application No. 2001-176843, a reaction by-product that deposits in the processing chamber can be removed but a boron oxide remains in the processing chamber. The residue of the boron oxide and an accompanying metallic film, and slight corrosion of the chamber member have come to cause a change in a processed shape or a pattern defect along with advancement of miniaturization.

As a result of a discussion made of production of a boron oxide, it has been found that the production can be qualitatively explained as mentioned below using binding energy between two molecules and a melting point. Table 1 lists the binding energies between diatomic molecules, and Table 2 lists the melting points of Ti compounds under atmospheric pressure.

TABLE 1

| | Binding energy between diatomic molecules(Kcal/mol) |
|---|---|
| Ti—O | 157 |
| Ti—N | 111 |
| Ti—F | 136 |
| Ti—Cl | 26 |
| B—O | 173 |
| B—N | 152 |
| B—F | 186 |
| H—O | 102 |
| H—F | 153 |
| C—O | 257 |
| C—N | 174 |
| C—F | 107 |

TABLE 2

| | Melting Point (° C.) |
|---|---|
| $TiF_3$ | 1200 |
| $TiF_4$ | 284 |
| $TiCl_4$ | −25 |
| $TiO_2$ | 1870 |
| $B_2O_3$ | 480 |

As listed in Table 2, the melting point of titanium dioxide ($TiO_2$) is as high as 1870° C., the melting point of titanium trifluoride ($TiF_3$) is as high as 1200° C., and the melting point of titanium tetrafluoride ($TiF_4$) is as high as 284° C. In contrast, the melting point of titanium tetrachloride ($TiCl_4$) is as low as −25° C. $TiCl_4$ is therefore readily volatilized. This signifies that utilization of a chloridizing reaction of Ti is effective in removing Ti from the surface of the processing chamber. As listed in Table 1, the binding energies between boron (B) and oxygen (O) and between B and fluorine (F) are higher than those between Ti and O, between Ti and F, and between B and O. Therefore, for example, O bound to Ti binds to B contained in $BCl_3$, and the remaining Ti binds to chlorine (Cl) contained in $BCl_3$. In other words, $BCl_3$ causes reduction of Ti and the chloridizing reaction thereof to occur simultaneously, and is therefore recognized as a gas suitable for production of $TiCl_4$. However, since the binding between B and O is utilized, a boron oxide is produced in due course. When a part containing oxygen is adopted as a chamber member, since boron binds to the oxygen, the boron oxide is produced. As listed in Table 2, diboron trioxide ($B_2O_3$) is a substance having a high melting point of 480° C. Once $B_2O_3$ is produced, it is hard to clean out $B_2O_3$. If a $BCl_3$ gas line is newly installed in a mass production factory devoid of the $BCl_3$ gas line, investment in facilities would cost enormously.

There has been a demand for cleaning during which a Ti reaction by-product can be removed using a certain general-purpose gas, and a quantity of foreign matters can be reduced without residue of a boron oxide.

The present invention addresses the foregoing problems. An object of the present invention is to provide a plasma processing method and a plasma processing apparatus capable of removing a Ti-series deposit from the surface of a processing chamber in the plasma processing apparatus without production of a foreign matter such as a boron oxide.

As an embodiment for addressing the foregoing problems, there is provided a plasma processing method for processing a Ti material in plasma using a plasma processing apparatus that includes a vacuum processing container provided with a processing chamber, a gas feeder which feeds a gas to the vacuum processing container, and a unit which feeds electromagnetic energy to be used to dissociate the gas so as to produce plasma. The plasma processing method includes a process of carbon-series deposition discharge which succeeds plasma processing during which a sample containing the Ti material is processed in plasma, and in which a carbon-series film is deposited on a Ti reaction by-product deposited on the surface of the processing chamber, and a process of chlorine-series discharge which succeeds the process of carbon-series deposition discharge and in which the carbon-series film and Ti are removed from the surface of the processing chamber.

A plasma processing apparatus includes a vacuum processing container, a processing chamber disposed in the vacuum processing chamber, a gas feeder that feeds a gas to the vacuum processing container, an energy feeding unit that feeds electromagnetic energy to be used to dissociate the gas so as to produce plasma, and a control unit that controls the gas feeder and energy feeding unit. Herein, the control unit controls the gas feeder and energy feeding unit so that after plasma processing is performed to process in plasma a sample containing a Ti material, carbon-series deposition discharge during which a carbon-series film is deposited on a Ti reaction by-product deposited on the surface of the processing changer is performed, and chlorine-series discharge during which the carbon-series film and Ti deposited on the surface of the processing chamber are removed is then performed.

According to an aspect of the present invention, there are provided a plasma processing method and a plasma processing apparatus capable of removing a Ti-series deposit from the surface of a processing chamber in the plasma processing apparatus without production of a foreign matter such as a boron oxide by carrying out carbon-series deposition discharge and succeeding chlorine-series discharge.

BRIEF DESCRIPTION OF THE DRAWINGS

FIG. 3A and FIG. 3B are illustrative diagrams showing a reaction mechanism that assuming that a Ti reaction by-product deposited on the surface of a processing chamber is $TiCl_x$, changes Ti on the surface of the processing change to $TiCl_4$, FIG. 3A shows a state attained after completion of product etching (process S1), and FIG. 3B shows a state attained during $Cl_2$ discharge (process S3);

FIG. 4A to FIG. 4D are illustrative diagrams showing a reaction mechanism that assuming that a Ti reaction by-product deposited on the surface of the processing chamber is $TiCl_x$, changes Ti on the surface of the processing chamber to $TiCl_4$, FIG. 4A shows a state attained after completion of the product etching (process S1), FIG. 4B shows a state attained after completion of $CHF_3$ discharge (process S2), FIG. 4C shows a state attained during the first half of $Cl_2$ discharge (process S3), and FIG. 4D shows a state attained during the second half of the $Cl_2$ discharge (process S3);

DESCRIPTION OF THE PREFERRED EMBODIMENTS

The present invention will be described below in relation to embodiments.

First Embodiment

Figure 10:
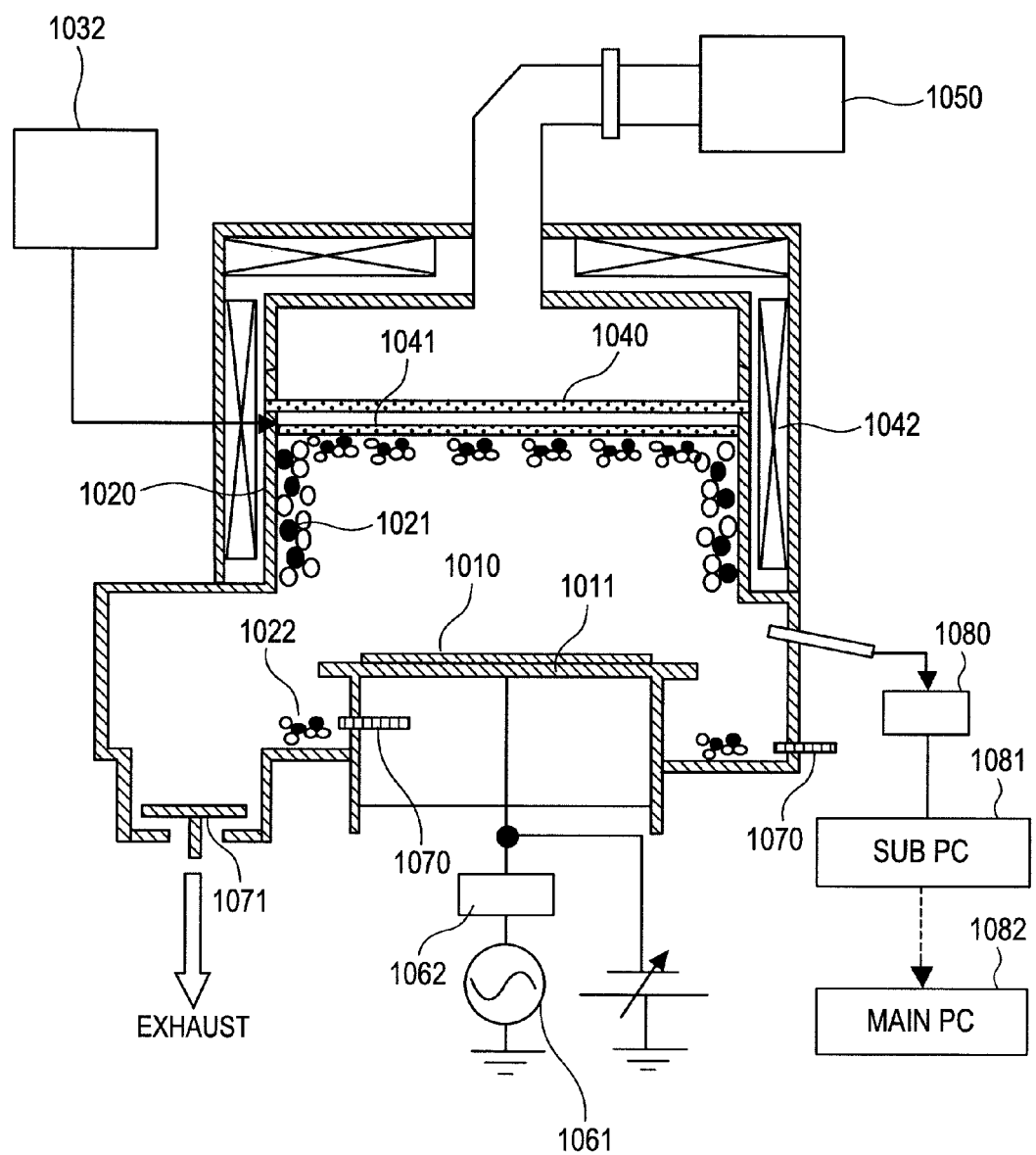
FIG. 10 is a schematic constitution diagram of a plasma processing apparatus (etching apparatus) employed in the first embodiment of the present invention.

A first embodiment of the present invention will be described in conjunction with FIG. 1 to FIG. 5 and FIG. 10. FIG. 10 is a schematic constitution diagram of a plasma processing apparatus employed in the present embodiment.

To begin with, the plasma processing apparatus employed in the present embodiment will be described below. The plasma processing apparatus (etching apparatus) shown in FIG. 10 includes an electrode 1011 on which a wafer 1010 is placed and which is disposed in a processing container, a gas feeder 1032, a top panel 1040, a shower plate 1041, an electromagnet 1042, a high-frequency waveguide 1050, a radiofrequency bias power supply 1061, a matching box 1062, a vacuum exhaust valve 1071 of a processing chamber, an emission spectroscope 1080, a unit in which an emission spectrum or data obtained by the emission spectroscope 1080 is stored (for example, a sub-personal computer (PC) 1081), and a main PC 1082 that controls the etching apparatus. The main PC 1082 can transmit or receive data to or from the sub-PC 1081.

Figure 1:
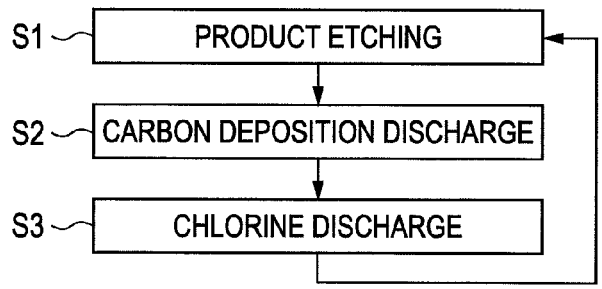
FIG. 1 is a flowchart describing a procedure employed in a plasma processing method in accordance with a first embodiment of the present invention.

Next, a description will be made of a plasma processing method in accordance with the present embodiment as well as the contents of a discussion on removal (cleaning) of a Ti reaction by-product. FIG. 1 is a flowchart describing a procedure employed in the plasma processing method in accordance with the present embodiment. First, in a process S1, product etching is performed in order to etch a product containing a Ti material. A Ti reaction by-product 1021 is deposited on the surface 1020 or the like of the processing chamber shown in FIG. 10. The deposit is checked to see if it can be cleaned out through gas discharge other than $BCl_3$ discharge. Table 1 listing the binding energies between diatomic molecules demonstrates that the binding energies between carbon (C) and O, between C and nitrogen (N), and between hydrogen (H) and F are higher than those between Ti and O, between Ti and N, and between Ti and F. In other words, there is a possibility that O, N, or F may be extracted from the Ti reaction by-product 1021. As a result of a discussion made on carbon depositional gases permitting the extraction, a trifluoromethane ($CHF_3$) gas that is one of the carbon depositional gases is cited as a candidate. Elements constituting the Ti reaction by-product mainly include fluorine (F) contained in a gas to be used to remove a silicon (Si)-series reaction by-product, nitrogen (N) contained in a thin film formed on an entity to be processed (semiconductor wafer or the like), and oxygen (O) contained in a material to be made into the plasma processing apparatus. By removing the elements from the Ti reaction by-product, Ti is thought to remain intact. Ti is supposed to be removed using a gas containing chlorine. Therefore, the Ti reaction by-product is thought to be cleaned out by introducing as a process, in which the Ti reaction by-product is removed, a process S3 of chlorine-series discharge, in which Ti is chloridized, immediately after a process S2 of carbon-series deposition discharge in which a carbon-series deposit film is caused to adhere the Ti reaction by-product in order to extract O, N, and F from the Ti reaction by-product. The carbon-series deposition discharge (process S2) and chlorine-series discharge (process S3) are carried out after an etched product (entity to be processed) is taken out of the plasma processing apparatus. When the carbon-series deposition discharge (process S2) and chlorine-series discharge (process S3) are carried out, a dummy sample (Si wafer or the like) may be placed on a sample station on which the entity to be processed is placed.

FIG. 3A and FIG. 3B are illustrative diagrams showing a reaction mechanism that causes Ti to change to $TiCl_4$ on the assumption that a Ti reaction by-product deposited on the surface of the processing chamber after completion of product etching (process S1) does not contain O, N, and F but is $TiCl_x$. FIG. 3A shows a state attained after completion of the product etching (process S1), and FIG. 3B shows a state attained during $Cl_2$ discharge. Incidentally, Cl contained in $TiCl_x$ has been contained in an etching gas used to process the Ti material. Reference numeral 301 denotes Cl, reference numeral 302 denotes Ti, and reference numeral 303 denotes a Cl radical. FIG. 4A to FIG. 4D are illustrative diagrams showing a reaction mechanism that causes Ti to change to $TiCl_4$ on the assumption that the Ti reaction by-product which is deposited on the surface of the processing chamber after completion of the product etching (process S1) contains O, N, and F. FIG. 4A shows a state attained after completion of the product etching, FIG. 4B shows a state attained after completion of $CHF_3$ discharge, FIG. 4C shows a state attained during (the first half of) $Cl_2$ discharge, and FIG. 4D shows a state attained during (the second half of) the $Cl_2$ discharge. Reference numeral 401 denotes F, reference numeral 402 denotes N, reference numeral 403 denotes O, reference numeral 404 denotes H, and reference numeral 405 denotes C.

Figure 2A:
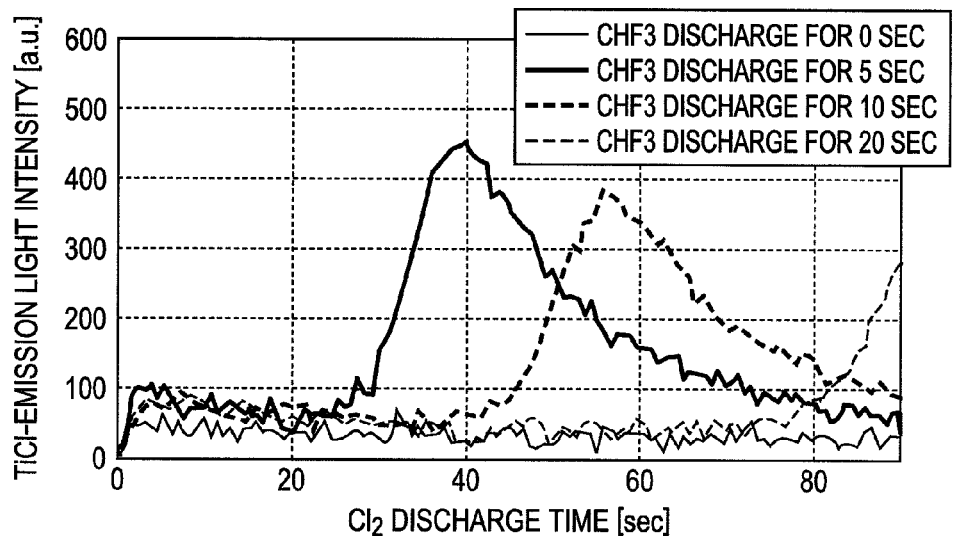
FIG. 2A is a graph indicating relationships between a TiCl-emission light intensity (wavelength of 419 nm) and a $Cl_2$ discharge time which are established during chlorine-series discharge (process S3) described in the flowchart of FIG. 1.

After product etching (process S1) during which a product containing a Ti material was etched was completed, $CHF_3$ discharge of an arbitrary time long (process S2) and $Cl_2$ discharge of 90 sec long (process S3) were carried out. The conditions for the $CHF_3$ discharge were such that a pressure was 0.4 Pa and a power was 500 W, while the conditions for the $Cl_2$ discharge were such that the pressure was 0.4 Pa and the power was 800 W. A $CHF_3$ discharge time was set to 0 sec (no discharge), 5 sec, 10 sec, and 20 sec. When a chloridizing reaction of the Ti reaction by-product on the surface of the processing chamber makes progress, light emission from TiCl occurs as light emission in plasma deriving from $Cl_2$ discharge. FIG. 2A is a graph indicating relationships between a TiCl-emission light intensity (wavelength of 419 nm) and the $Cl_2$ discharge time which is established during cleaning (process S3). When the $CHF_3$ discharge is not carried out (0 sec) (equivalent to a case where the process S2 is not performed), an increase in the TiCl-emission light intensity signifying a degree of progress of chemical cleaning is not identified. This means that the reaction mechanism that changes Ti into TiCl4 as shown in FIG. 3A and FIG. 3B is not activated. Namely, there is a high possibility that the Ti reaction by-product may not be $TiCl_x$ capable of being removed without the necessity of carrying out carbon-series deposition discharge (process S2), but that Ti might, as shown in FIG. 4A, have bound to any of oxygen (O) 403, nitrogen (N) 402, and fluorine (F) 401 during product etching.

In contrast, under the condition that $CHF_3$ discharge occurs (5 sec or more), after the TiCl-emission light intensity increases, it decreases. Specifically, as shown in FIG. 4B, oxygen (O) 403, fluorine (F) 401, and nitrogen (N) 402 are extracted from the Ti reaction by-product by carbon (C) 405 and hydrogen (H) 404 contained in a CFx film or a CHx film that adheres to the Ti reaction by-product due to $CHF_3$ discharge. As shown in FIG. 4C and FIG. 4D, during $Cl_2$ discharge, C is thought to be changed to CClx and volatilized, and Ti is thought to be changed to TiCl4 and volatilized. Thus, it is verified that the Ti reaction by-product deposited on the surface of the processing chamber can be efficiently cleaned out (removed) by performing the $Cl_2$ discharge immediately after preprocessing of $CHF_3$ discharge. A C-series deposit deposited during the preprocessing of $CHF_3$ discharge is cleaned out as a $CCl_4$ gas during the $Cl_2$ discharge. Therefore, a nonvolatile substance of a boron oxide that derives from $BCl_3$ discharge is not left intact.

Figure 2B:
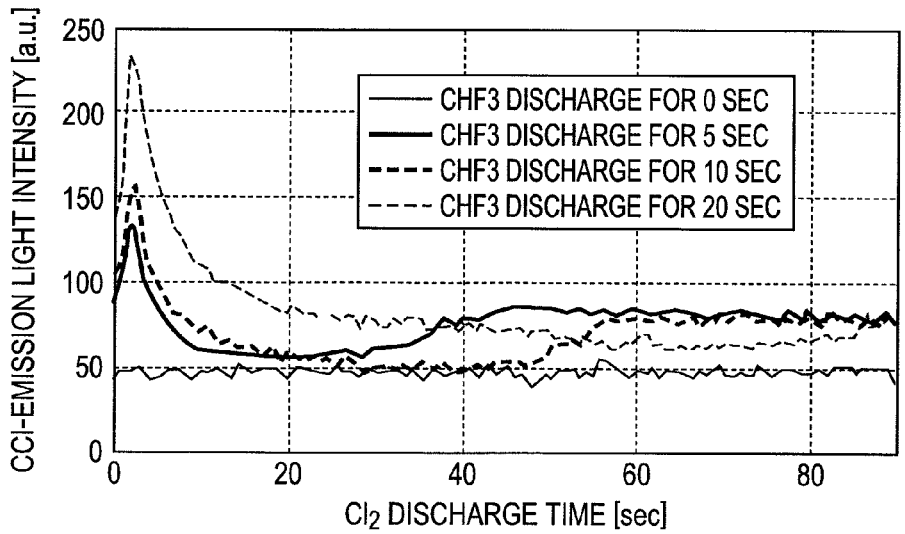
FIG. 2B is a graph indicating relationships between a CCl-emission light intensity and the $Cl_2$ discharge time which are established during the chlorine-series discharge (process S3) described in the flowchart of FIG. 1.

The longer the $CHF_3$ discharge time is, the longer a time that elapses until the TiCl-emission light intensity begins increasing is. FIG. 2B shows temporal changes in the CCl-emission light intensity occurring during $Cl_2$ discharge. As seen from the drawing, the longer the $CHF_3$ discharge time is, the larger the intensity of light emitted from CCl during the $Cl_2$ discharge is. Besides, an attenuation time gets longer. Namely, as the $CHF_3$ discharge time is longer, a C film deposited over a Ti layer shown in FIG. 4B gets thicker, and the time it takes for Cl to reach titanium (Ti) 302 during the $Cl_2$ discharge gets longer. As seen from comparison of the TiCl-emission light intensity observed after 5 sec of $CHF_3$ discharge with the TiCl-emission light intensity observed after 10 sec of the $CHF_3$ discharge, the TiCl-emission light intensity observed after 5 sec of the $CHF_3$ discharge is sufficiently large. Namely, once carbon is deposited to form one layer on the surface of the processing chamber, a Ti compound is thought to be able to be fully reduced.

Figure 5:
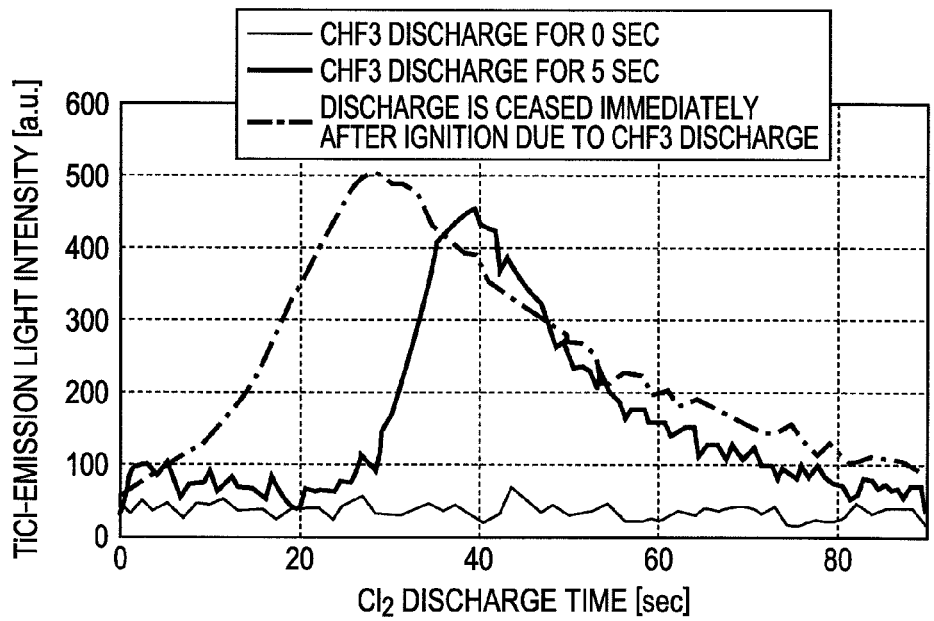
FIG. 5 is another graph indicating relationships between the TiCl-emission light intensity and the $Cl_2$ discharge time which are established during the chlorine-series discharge (process S3) described in the flowchart of FIG. 1.

An experiment was conducted to detect ignition of plasma, which derives from $CHF_3$ discharge, by sensing light emission at intervals of 0.1 sec, and to terminate the $CHF_3$ discharge simultaneously with the ignition. FIG. 5 is a graph indicating relationships between a TiCl-emission light intensity observed during chlorine-series discharge (process S3) and a $Cl_2$ discharge time, and shows changes in the TiCl-emission light intensity occurring during $Cl_2$ discharge in a case where the $CHF_3$ discharge is ceased immediately after the ignition due to the $CHF_3$ discharge. The TiCl-emission light intensities observed after 0 sec of the $CHF_3$ discharge and 5 sec of the $CHF_3$ discharge are also shown for comparative study. When the $CHF_3$ discharge is ceased immediately after the ignition due to the $CHF_3$ discharge is detected, compared with when the $CHF_3$ discharge is performed for 5 sec, a time it takes for the light intensity to rise is short, and the light intensity is sufficiently large. Therefore, a carbon deposit film necessary to form one layer on the surface can be fed for a very short time. Therefore, the $CHF_3$ discharge can be ceased immediately after the ignition due to the discharge is detected. Therefore, not only the time required for the carbon-series deposition discharge process S2 but also the time it takes to remove the carbon deposit film in the process S3 of chlorine-series discharge can be shortened. This would prove effective from the viewpoint of improvement of a throughput.

Processing of a gate of a semiconductor device including a metal oxide semiconductor (MOS) transistor that contains electrons or holes as a carrier was performed according to the procedure described in FIG. 1. In the process S1, a silicon (Si) wafer having a titanium nitride (TiN) film formed thereon was carried into the processing chamber of the plasma processing apparatus, and the TiN film formed on the Si wafer was etched to be patterned. After the etched Si wafer was taken out, $CHF_3$ discharge of 1 sec long (process S2) and $Cl_2$ discharge of 90 sec long (process S3) were carried out. As a result, even after the processing was repeated 1000 times, neither degradation of precision in processing of the TiN film nor a pattern defect due to a foreign matter was discovered. Prospect of stable mass production of the semiconductor device is hopeful. Incidentally, the processes S1 to S3 are controlled and executed by the main PC 1082.

In the present embodiment, light emission is sensed in order to cease $CHF_3$ discharge immediately after ignition due to the $CHF_3$ discharge is detected. Alternatively, a rise in a pressure or a decrease in a reflected power of a source power may be sensed. Whether discharge is continuously performed between the process S2 of carbon-series deposition discharge and the process S3 of chlorine-series discharge may be freely decided. However, when discharge is continuously performed, improvement of a throughput is expected.

In the process S2 of carbon-series deposition discharge, a $CHF_3$ gas is employed. Gases that provide the same effect include methane ($CH_4$), $CH_3F$, hexafluoro-1,3-butadiene ($C_4F_6$), perfluorocyclobutane ($C_4F_8$), and $CHF_2$. $CH_4$ is preferable because it is a compound of C that exerts large binding energy with respect to O or N, and H that exerts large binding energy with respect to F. One of the gases may be used by itself or may be mixed with any other one. Likewise, although a $Cl_2$ gas is employed in the process S3 of chlorine-series discharge, hydrochloric acid (HCl) may be adopted. One of the gases may be used by itself or may be mixed with each other.

Incidentally, it is hard to remove a Ti-series reaction by-product 1022, which is deposited in the lower part of the processing chamber, by performing the processing of the processes S2 and S3, because the lower part of the processing chamber is not a plasma generation area. The Ti-series reaction by-product 1022 in the lower part of the processing chamber may duly soar to return to the upper part of the processing chamber, and become a cause of a foreign matter. In order to avoid this incident, a blower tube 1070 making it possible to feed a gas through the flank of the processing chamber or through a portion by the side of the electrode, and blow off a deposit in the lower part of the processing chamber is preferably installed. A gas is fed at a flow velocity of 500 sccm or more through the blower tube 1070 during the process S2 of carbon-series deposition discharge and the process S3 of chlorine-series discharge, whereby the Ti-series reaction by-product 1021 can be blown away. Part of the Ti-series reaction by-product is released, and the other part thereof is blown away into the upper part of the processing chamber. In the process S2 of carbon-series deposition discharge, Ti being blown away into the upper part of the processing chamber is reduced in plasma. In the process S2 of $Cl_2$ discharge, Ti is chloridized and removed. The type of gas being ejected through the blower tube 1070 may be identical to that employed in the process S2 of carbon-series deposition discharge or in the process S3 of chlorine-series discharge. Alternatively, argon (Ar) or helium (He) that is an inertial gas may be substituted.

As mentioned above, there are provided a plasma processing method and a plasma processing apparatus capable of removing a Ti deposit from the surface of the processing chamber of the plasma processing apparatus without production of a foreign matter such as a boron oxide by performing carbon-series deposition discharge and chlorine-series discharge after completion of product etching. In addition, when a blower tube is included, a Ti reaction by-product deposited in an area other than a plasma generation area can be efficiently removed.

Second Embodiment

A second embodiment of the present invention will be described in conjunction with FIG. 6, FIG. 7, and FIG. 9. Incidentally, information that has been described in relation to the first embodiment but will not be described in relation to the present embodiment can be applied to the present embodiment unless exceptional circumstances arise.

In relation to the first embodiment, a description has been made of that Ti deposited on the surface of the processing chamber can be cleaned out by performing the process S3 of chlorine-series discharge immediately after completion of the process S2 of carbon-series deposition discharge. However, if a Ti reaction by-product is thickly deposited on the surface of the processing chamber during product etching (process S1), or if the Ti reaction by-product is thickly deposited because the product etching has already been repeated plural times, the deposit of the Ti reaction by-product cannot be fully cleaned out by once performing the process S2 of carbon-series deposition discharge and the process S3 of chlorine-series discharge. This is because a carbon-series film deposited on the surface of the processing chamber during the process S2 of carbon-series deposition discharge cannot fully advance in a depth direction of the Ti deposit film. Therefore, in this case, the deposit of the Ti reaction by-product is step-wise removed by repeating multiple times the cycle including the process S2 of carbon-series deposition discharge and the process S3 of chlorine-series discharge. The process S2 of carbon-series deposition discharge and the process S3 of chlorine-series discharge shall be integrated into a cycle and called cycle cleaning.

For deciding whether Ti is removed in a case where cycle cleaning is employed, light emission from TiCl made during $Cl_2$ discharge is sensed every time the cleaning is performed. A decision is then made based on whether a light intensity exceeds a reference value. FIG. 6 is a flowchart describing a procedure employed in a plasma processing method in accordance with the present embodiment. Namely, as shown in FIG. 6, chlorine-series discharge (process S3) is succeeded by a process S4 in which whether a remaining amount of Ti in the processing changer is equal to or smaller than the reference value is decided. When the remaining amount of Ti becomes equal to or smaller than the reference value, the cycle cleaning is terminated. For making a decision on the remaining amount of Ti in the processing chamber, employment of light emission from TiCl is preferred.

Figure 6:
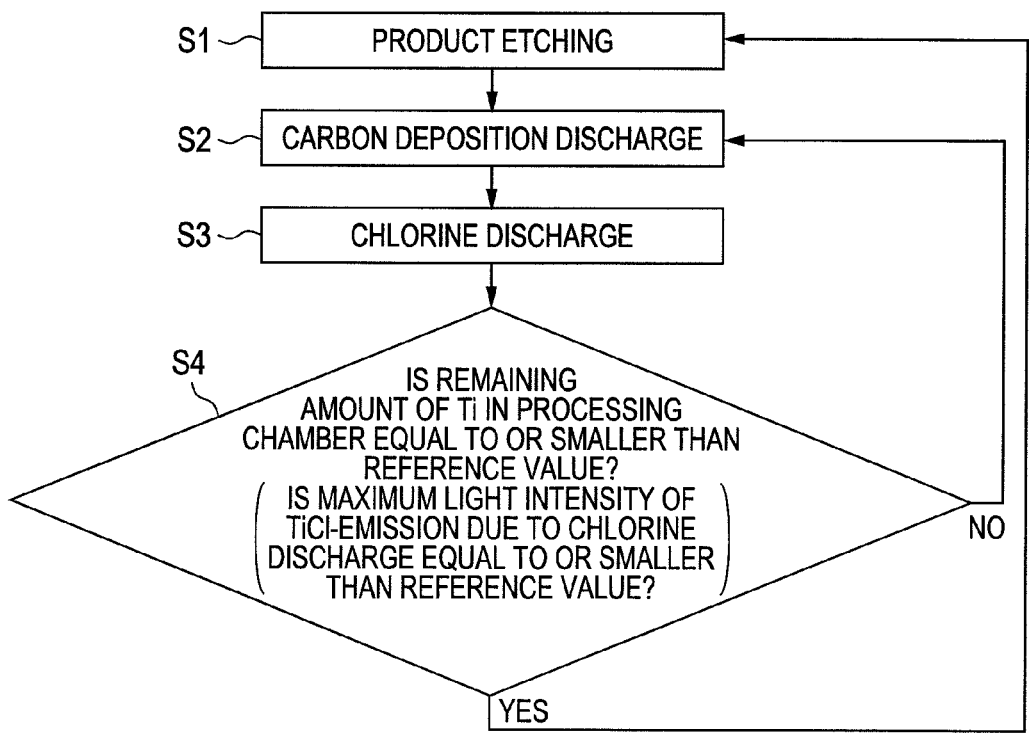
FIG. 6 is a flowchart describing a procedure employed in a plasma processing method in accordance with a second embodiment (cycle cleaning) of the present invention.
Figure 7:
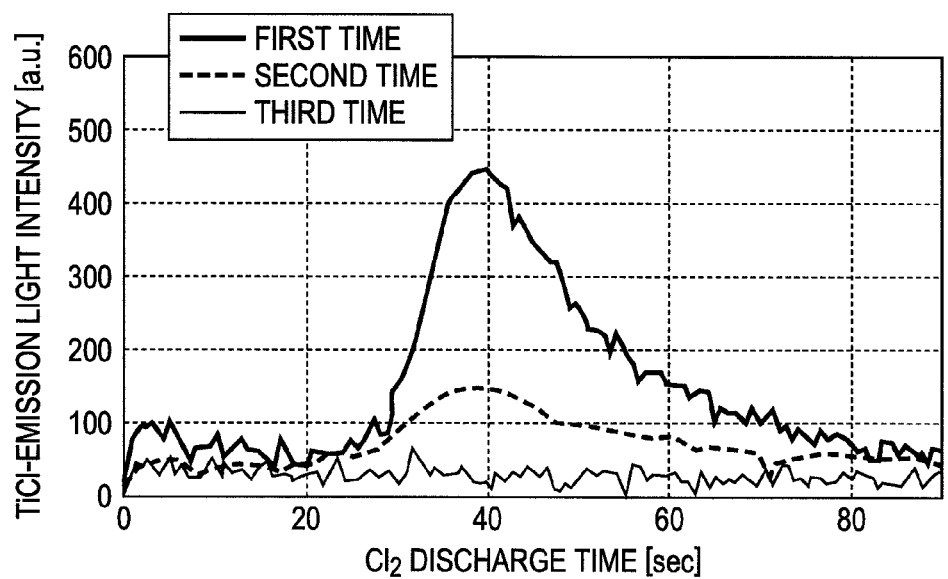
FIG. 7 is a graph indicating relationships between a TiCl-emission light intensity and a $Cl_2$ discharge time which are established during chlorine-series discharge (process S3) described in the flowchart of FIG. 6.

FIG. 7 is a graph indicating relationships between a TiCl-emission light intensity and a $Cl_2$ discharge time which are established during chlorine-series discharge (process S3) described in the flowchart of FIG. 6. FIG. 7 shows changes in the TiCl-emission light intensity occurring during $Cl_2$ discharge in a case where $CHF_3$ discharge of 5 sec long and the $Cl_2$ discharge are repeated three times after completion of product etching. The TiCl-emission light intensity increases during the first and second cycles, but does not increase during the third cycle. Therefore, Ti to be removed does not remain in the processing chamber after completion of the third $Cl_2$ discharge. For example, one of methods for deciding whether cycle cleaning should be terminated is, as described in FIG. 6, such that if a maximum light intensity observed during the $Cl_2$ discharge is equal to or smaller than 130, the cycle cleaning should be terminated.

Figure 9:
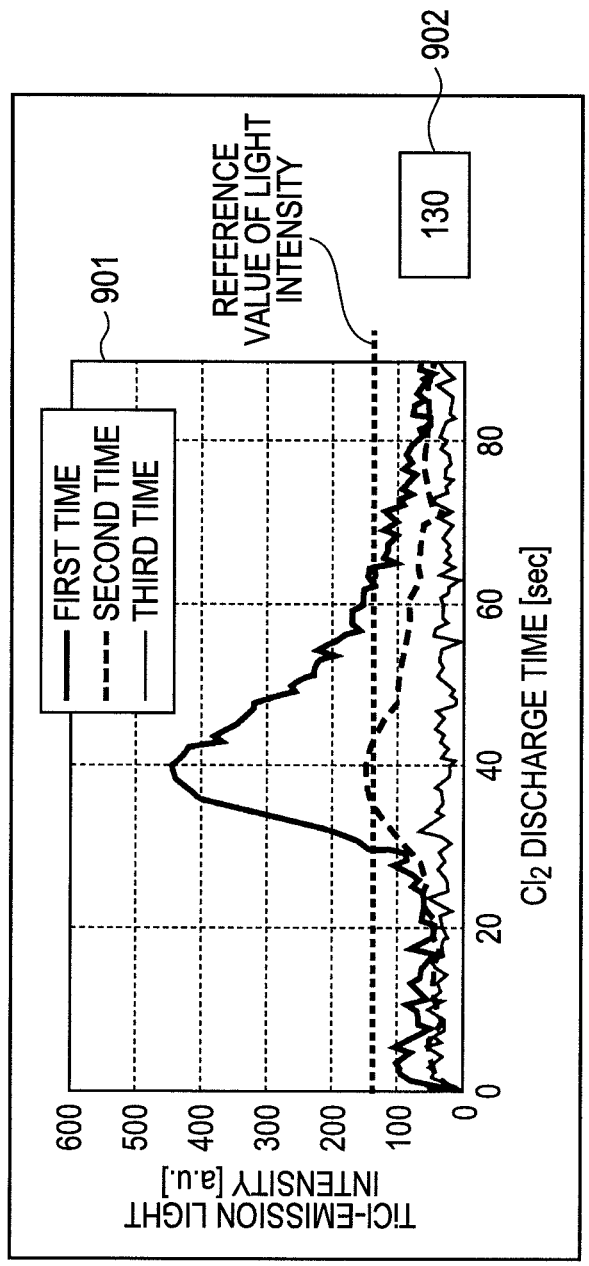
FIG. 9 is a diagram showing an example of a setting screen image through which termination of cycle cleaning is decided and which is employed during a process S4 described in FIG. 6.

FIG. 9 is a diagram showing an example of a setting screen image through which termination of cycle cleaning is decided at the time of use for mass production. The screen image includes a display section 901 in which a history of intensities of light emitted in a process of chlorine-series discharge, or a temporal change in the intensity of light emitted therein, is displayed, and an input section 902 in which a reference value based on which cease of cycle discharge is determined. After the reference value is set, every time the process S3 of chlorine-series discharge is performed, whether the cycle cleaning should be continued is automatically decided based on a change in the light intensity. The setting screen image through which termination of the cycle cleaning is decided at the time of use for mass production and which is shown in FIG. 9 is displayed by the main PC.

Processing of a gate of a semiconductor device including a MOS transistor was performed according to the procedure described in FIG. 6. In the process S1, a Si wafer on which a TiN film was formed was carried into the processing chamber of the plasma processing apparatus, and the TiN film formed on the Si wafer was etched to be patterned. After the etched Si wafer was taken out, cycle cleaning including $CHF_3$ discharge of 1 sec long (process S2) and $Cl_2$ discharge of 90 sec long (process S3) was carried out. As a result, even after the processing was repeated 1000 times, degradation of precision in processing of the TiN film or a pattern defect due to a foreign matter was not discovered. Prospect of stable mass production of the semiconductor device is hopeful. Incidentally, the processes S1 to S4 are controlled and executed by the main PC 1082.

A TiCl-emission light intensity was employed in the foregoing experiment. Alternatively, a change in an intensity of light emitted from Ti dissociated from TiCl may be adopted in the same manner.

The duration time of $Cl_2$ discharge included in the cycle cleaning may be fixed. Alternatively, a time point within the cycle cleaning at which a TiCl-emission light intensity becomes maximal (when about 40 sec has elapsed within the first cycle) may be detected in real time during the $Cl_2$ discharge. A time point at which a time obtained as the sum of a time, which elapses until the TiCl-emission light intensity becomes maximal, and a time calculated by multiplying the time, which elapses until the TiCl-emission light intensity becomes maximal, by a certain percentage (for example 50%) has elapsed may be regarded as a terminal point of the $Cl_2$ discharge. Instead of removing a small amount of Ti by continuously performing the $Cl_2$ discharge until the TiCl-emission intensity is not observed any longer, the $Cl_2$ discharge should be suspended in order to decrease the cycle time of the cycle cleaning so that Ti which has been reduced and is readily removable will exist. In some cases, this proves effective in shortening the time required for Ti removal.

As mentioned above, there are provided a plasma processing method and a plasma processing apparatus capable of removing a Ti deposit from the surface of a processing chamber of the plasma processing apparatus without production of a foreign matter such as a boron oxide by performing both carbon-series deposition discharge and chlorine-series discharge after completion of product etching. When cycle cleaning is performed, a deposit of a Ti reaction by-product can be reliably removed. In addition, when a reference value based on which cease of cycle discharge is determined is set, Ti removal can be automatically decided.

Third Embodiment

A third embodiment of the present invention will be described below in conjunction with FIG. 8. Incidentally, information that has been described in relation to the first or second embodiment but will not be described in relation to the present embodiment can be applied to the present embodiment unless exceptional circumstances arise.

Figure 8:
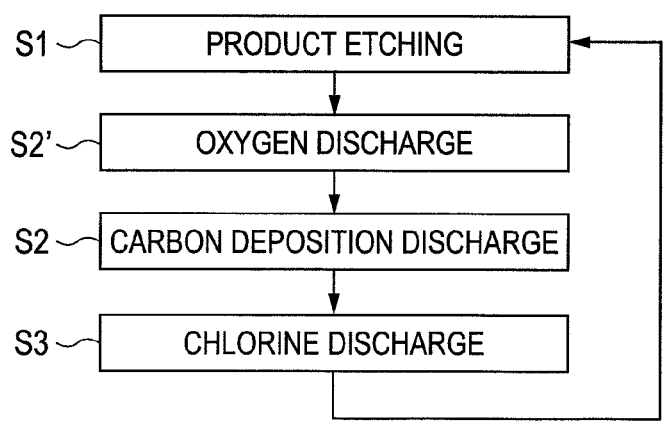
FIG. 8 is a flowchart describing a procedure employed in a plasma processing method in accordance with a third embodiment (oxygen discharge) of the present invention.

FIG. 8 is a flowchart describing a procedure employed in a plasma processing method in accordance with the present embodiment. In the present embodiment, a process S2' of oxygen discharge is inserted between product etching (process S1) and carbon-series deposition discharge (process S2) which are described in relation to the first embodiment by referring to FIG. 1). An effect of the oxygen discharge will be described below.

As seen from Table 1, comparison of binding energies between Ti and N, between Ti and Cl, between Ti and F, and between Ti and O with one another demonstrates that the binding energy between Ti and O is highest. In other words, Ti has a tendency of being changed to an oxide. Among the binding energies between C and F, between C and N, and between C and O, the binding energy between C and O is highest. The binding energy between C and O is higher than the one between Ti and O. Specifically, a product containing Ti is etched, a reaction by-product whose composition is unknown and which is deposited on the surface of the processing chamber is used to produce a Ti oxide in the process S2' of oxygen discharge, Ti and O are reduced in the process S2 of carbon-series deposition discharge, and solid Ti is volatilized as $TiCl_4$ in the process S3 of chlorine-series discharge. As a gas to be employed in the process S2' of oxygen discharge, a dioxygen ($O_2$) gas is available.

Processing of a gate of a semiconductor device including a MOS transistor was performed according to the procedure described in FIG. 8. In the process S1, a Si wafer on which a TiN film was formed was carried into the processing chamber of the plasma processing apparatus, and the TiN film formed on the Si wafer was etched to be patterned. After the etched Si wafer was taken out, oxygen discharge (process S2') of 1 sec long, $CHF_3$ discharge of 1 sec long (process S2), and $Cl_2$ discharge of 90 sec long (process S3) were carried out. As a result, even after the processing was repeated 1000 times, degradation of precision in processing of the TiN film or a pattern defect due to a foreign matter was not discovered. Prospect of stable mass production of the semiconductor device is hopeful. Incidentally, the processes S1 to S3 are controlled and executed by the main PC 1082.

As mentioned above, there are provided a plasma processing method and a plasma processing apparatus capable of removing a Ti-series deposit from the surface of the processing chamber of the plasma processing apparatus without production of a foreign matter such as a boron oxide by performing both carbon-series deposition discharge and chlorine-series discharge after completion of product etching. In addition, when oxygen discharge is added, elements contained in a Ti reaction by-product can be changed to elements O. Since Ti and O are reduced during the carbon-series deposition discharge, the reproducibility of cleaning can be upgraded.

In the flows in accordance with the present invention described in FIG. 1, FIG. 6, and FIG. 8, the process S1 of product etching is continued even after the process S3 of chlorine-series discharge is completed. However, if only a small amount of Ti is deposited on the surface of the processing chamber by performing product etching once, the process S2 of carbon-series deposition discharge and the process S3 of chlorine-series discharge need not be carried out every time. For example, even if the processes S2 and S3 are performed once for one lot or once for two lots, it would prove effective.

The present invention is not limited to the aforesaid embodiments but encompasses various variants. For example, the embodiments have been described for a better understanding of the present invention. The present invention is not necessarily limited to a plasma processing method and a plasma processing apparatus which include all described constituent features. Part of the constituent features of a certain embodiment may be replaced with constituent features of another embodiment. A certain embodiment may be provided with a constituent feature of another embodiment. Part of the constituent features of each of the embodiments may be added to another embodiment, deleted, or replaced with those of another embodiment.

The present invention has been described so far. Major modes of the invention will be described below.

(1) A plasma processing method for processing a Ti material in plasma using a plasma processing apparatus that includes a vacuum processing container in which a processing chamber is formed, a gas feeder which feeds a gas to the vacuum processing container, and a unit which feeds electromagnetic energy to be used to dissociate the gas so as to produce plasma is characterized in that the plasma processing method includes:

a process of carbon-series deposition discharge which succeeds the processing in plasma of a sample containing the Ti material and in which a carbon-series film is deposited on a Ti reaction by-product deposited on the surface of the processing chamber; and a process of chlorine-series discharge which succeeds the process of carbon-series deposition discharge and in which the carbon-series film and Ti deposited on the surface of the processing chamber are removed.

(2) The plasma processing method set forth in paragraph (1) is characterized in that a process of oxygen discharge in which the Ti reaction by-product deposited on the surface of the processing chamber is changed to a Ti oxide is introduced immediately prior to the process of carbon-series deposition discharge.

(3) The plasma processing method set forth in paragraph (1) or (2) is characterized in that:

a gas employed in the process in which the carbon-series film is deposited is at least one of a $CHF_3$ gas, a $CH_4$ gas, a $C_4F_6$ gas, a $C_4F_8$ gas, a $CH_3F$ gas, and a $CHF_2$ gas; and a gas employed in the process in which the carbon-series film and Ti are removed is at least one of a $Cl_2$ gas and an HCl gas.

(4) The plasma processing method set forth in paragraph (2) is characterized in that a gas employed in the process of oxygen discharge is an $O_2$ gas.

(5) The plasma processing method set forth in paragraph (1) or (2) is characterized in that the process of carbon-series deposition discharge includes a detection process in which ignition of plasma is detected using light emission, a change in a reflected power of a source power, or a change in a pressure, and a process in which information detected in the detection process is used to terminate discharge immediately after the plasma ignition is detected.

(6) The plasma processing method set forth in any of paragraphs (1) to (5) is characterized in that the process of carbon-series deposition discharge and the process of chlorine-series discharge are repeated.

(7) The plasma processing method set forth in paragraph (6) is characterized in that:

the plasma processing method further includes a process in which a remaining amount of Ti in the processing chamber is checked;

if a maximum intensity of light emitted from TiCl or Ti during the process of chlorine-series discharge, from which the remaining amount of Ti on the surface of the processing chamber can be inferred, is equal to or smaller than a reference value, repetition of the process of carbon-series deposition discharge and the process of chlorine-series discharge is ceased.

(8) The plasma processing method set forth in any of paragraphs (1) to (6) is characterized in that discharge between the process of carbon-series deposition discharge and the process of chlorine-series discharge is continued.

(9) The plasma processing method set forth in paragraph (2) or (4) is characterized in that discharge between the process of oxygen discharge and the process of carbon-series deposition discharge is continued.

(10) The plasma processing method set forth in any of paragraphs (1) to (9) is characterized in that a blower gas is ejected into the processing chamber in the course of each of the process of carbon deposition and the process of chlorine-series discharge, and the Ti-series reaction by-product deposited in an area other than a plasma generation area is blown away into the plasma generation area and then removed.

(11) The plasma processing method set forth in any of paragraphs (1) to (10) is characterized in that the process of chlorine-series discharge is carried out immediately after completion of the process of carbon-series deposition discharge.

(12) A plasma processing apparatus including a vacuum processing container, a processing chamber disposed in the vacuum processing container, a gas feeder that feeds a gas into the vacuum processing container, and an energy feeding unit that feeds electromagnetic energy to be used to dissociate the gas so as to produce plasma is characterized in that:

in the processing chamber, a sample containing a Ti material is processed in plasma; and the plasma processing apparatus further includes a blower tube through which a gas to be used to blow away a Ti reaction by-product deposited in an area other than a plasma generation area in the interior of the processing chamber is ejected.

(13) A plasma processing apparatus including a vacuum processing container, a processing chamber disposed in the vacuum processing container, a gas feeder that feeds a gas into the vacuum processing container, an energy feeding unit that feeds electromagnetic energy to be used to dissociate the gas so as to produce plasma, and a control unit that controls the gas feeder and energy feeding unit is characterized in that:

the control unit controls the gas feeder and energy feeding unit so that after a sample containing a Ti material is processed in plasma, carbon-series deposition discharge during which a carbon-series film is deposited on a Ti reaction by-product deposited on the surface of the processing chamber is performed, and chlorine-series discharge during which the carbon-series film and Ti deposited on the surface of the processing chamber are removed is then performed.

(14) The plasma processing apparatus set forth in paragraph (13) is characterized in that the control unit controls the gas feeder and energy feeding unit so that the carbon-series deposition discharge and chlorine-series discharge are repeated plural times according to the relationship between a TiCl-emission light intensity and a chlorine gas discharge time.

(15) The plasma processing apparatus set forth in paragraph (14) is characterized in that:

the control unit includes a display screen; and on the display screen, a history of intensities of light emitted from Ti or TiCl, or a temporal change in the intensity of light emitted from Ti or TiCl, and a setting screen image through which termination of repetition of the carbon-series deposition discharge and chlorine-series discharge is decided are displayed.

(16) The plasma processing apparatus set forth in paragraph (13) is characterized in that the control unit controls the gas feeder and energy feeding unit so that oxygen discharge is performed prior to the carbon-series deposition discharge after the sample containing the Ti material is processed in plasma.

What is claimed is:

1. A plasma processing method for etching a sample containing a Ti material, in a plasma, comprising:
    a step of performing carbon-series deposition discharge during which a carbon-series film is deposited on a Ti reaction by-product deposited on a surface of a processing chamber in which the sample containing the Ti material was etched in the plasma;
    a step of performing chlorine-series discharge during which the Ti deposited on the surface of the processing chamber is removed, after the step of performing carbon-series deposition discharge, and further comprising:
    a step of performing oxygen discharge during which the Ti reaction by-product deposited on the surface of the processing chamber is changed to a Ti oxide, just before the step of performing carbon-series deposition discharge.

2. The plasma processing method according to claim 1, wherein:

a gas employed at the step of performing the carbon-series deposition discharge is at least one of a $CHF_3$ gas, a $CH_4$ gas, a $C_4F_6$ gas, a $C_4F_8$ gas, a $CH_3F$ gas, and a $CHF_2$ gas; and a gas employed at the step of performing chlorine-series discharge is at least one of a $Cl_2$ gas and a HCl gas.

3. The plasma processing method according to claim 1, wherein a blower gas is ejected into the processing chamber in the course of each of the step of performing carbon-series deposition discharge and the step of performing chlorine-series discharge, and the Ti reaction by-product deposited in an area other than a plasma generation area is blown away into the plasma generation area and then removed.

4. The plasma processing method according to claim 1, further comprising, prior to said step of performing the carbon-series deposition, a step of etching the sample containing the Ti material, in the plasma.

5. The plasma processing method according to claim 4, wherein the step of etching the sample containing the Ti material is performed with an etching gas containing chlorine.

6. A plasma processing method for etching a sample containing a Ti material, in a plasma, comprising:
    a step of performing carbon-series deposition discharge during which a carbon-series film is deposited on a Ti reaction by-product deposited on a surface of a processing chamber in which the sample containing the Ti material was etched in the plasma; and
    a step of performing chlorine-series discharge during which the Ti deposited on the surface of the processing chamber is removed, after the step of performing carbon-series deposition discharge, wherein:
    a gas employed at the step of performing carbon-series deposition discharge is at least one of a $CHF_3$ gas, a $C_4F_6$ gas, a $CH_3F$ gas, a $C_4F_8$ gas and a $CHF_2$ gas; and
    a gas employed at the step of performing chlorine-series discharge is at least one of a $Cl_2$ gas and a HCl gas.

7. A plasma processing method for etching a sample containing a Ti material, in a plasma, comprising:
    a step of performing carbon-series deposition discharge during which a carbon-series film is deposited on a Ti reaction by-product deposited on a surface of a processing chamber in which the sample containing the Ti material was etched in the plasma; and
    a step of performing chlorine-series discharge during which the Ti deposited on the surface of the processing chamber is removed, after the step of performing carbon-series deposition discharge, wherein:
    the step of performing carbon-series deposition discharge and the step of performing chlorine-series discharge are performed in the presence of a dummy sample in the processing chamber.

8. A plasma processing method for etching a sample containing a Ti material, in a plasma, comprising:
    a step of performing carbon-series deposition discharge during which a carbon-series film is deposited on a Ti reaction by-product deposited on a surface of a processing chamber in which the sample containing the Ti material was etched in the plasma; and
    a step of performing chlorine-series discharge during which the Ti deposited on the surface of the processing chamber is removed, after the step of performing carbon-series deposition discharge, wherein:
    the steps of performing carbon-series deposition discharge followed by performing chlorine-series discharge are repeated.

* * * * *